(12) United States Patent
Chen et al.

(10) Patent No.: US 9,360,778 B2
(45) Date of Patent: Jun. 7, 2016

(54) SYSTEM AND METHOD FOR LITHOGRAPHY PATTERNING

(75) Inventors: Li-Jui Chen, Hsinchu (TW); Fu-Jye Liang, Kaohsiung (TW); Hsueh-Hung Wu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 896 days.

(21) Appl. No.: 13/411,245

(22) Filed: Mar. 2, 2012

(65) Prior Publication Data

US 2013/0229638 A1   Sep. 5, 2013

(51) Int. Cl.
*G03B 27/42* (2006.01)
*G03B 27/58* (2006.01)
*G03B 27/32* (2006.01)
*G03F 9/00* (2006.01)

(52) U.S. Cl.
CPC .......... *G03F 9/7096* (2013.01); *G03F 9/7019* (2013.01)

(58) Field of Classification Search
CPC ....... G03F 9/70; G03F 9/7003; G03F 9/7019; G03F 9/7092; G03F 9/7096; G03F 7/70625; G03F 7/70633; G03F 7/70666; G03F 7/70675; G03F 7/70683; G03F 7/70775; G03F 7/70975; G03F 7/70991
USPC ........... 355/27, 30, 52, 53, 55, 67–71, 72–77; 356/399–401; 250/492.1, 492.2, 250/492.22, 548; 430/5, 8, 22, 30, 311, 312
See application file for complete search history.

(56) References Cited

U.S. PATENT DOCUMENTS

| | | | |
|---|---|---|---|
| 4,741,622 A * | 5/1988 | Suwa et al. | 356/401 |
| 5,477,057 A * | 12/1995 | Angeley et al. | 250/548 |
| 6,166,801 A * | 12/2000 | Dishon et al. | 355/27 |
| 6,636,311 B1 * | 10/2003 | Ina et al. | 356/401 |
| 6,753,120 B2 | 6/2004 | Kim | |
| 6,861,331 B2 | 3/2005 | Rossiger et al. | |
| 6,952,262 B2 | 10/2005 | Yamamoto | |
| 7,123,362 B2 | 10/2006 | Ban | |
| 7,332,732 B2 | 2/2008 | Van Bilsen et al. | |
| 7,379,190 B2 | 5/2008 | Hill | |
| 7,439,531 B2 | 10/2008 | Van Bilsen et al. | |
| 7,535,549 B2 | 5/2009 | Cherala et al. | |
| 2001/0028456 A1 * | 10/2001 | Nishi | 356/400 |
| 2004/0227925 A1 * | 11/2004 | Sato | 355/72 |
| 2005/0122495 A1 * | 6/2005 | Kaplan et al. | 355/52 |
| 2010/0007875 A1 * | 1/2010 | Li | 356/237.5 |
| 2011/0013165 A1 * | 1/2011 | Kaneko et al. | 355/61 |
| 2011/0205515 A1 * | 8/2011 | Menchtchikov et al. | 355/67 |

* cited by examiner

*Primary Examiner* — Christina Riddle
(74) *Attorney, Agent, or Firm* — Haynes and Boone, LLP

(57) ABSTRACT

Disclosed is a lithography system. The lithography system includes a lithography exposure tool designed for performing an exposure process to a radiation-sensitive material layer coated on an integrated circuit substrate; an alignment module coupled with the lithography exposure tool, designed for alignment measurement, and configured for transferring the integrated circuit substrate to the lithography exposure tool; and an alignment calibration module designed to calibrate the alignment module relative to the lithography exposure.

20 Claims, 9 Drawing Sheets

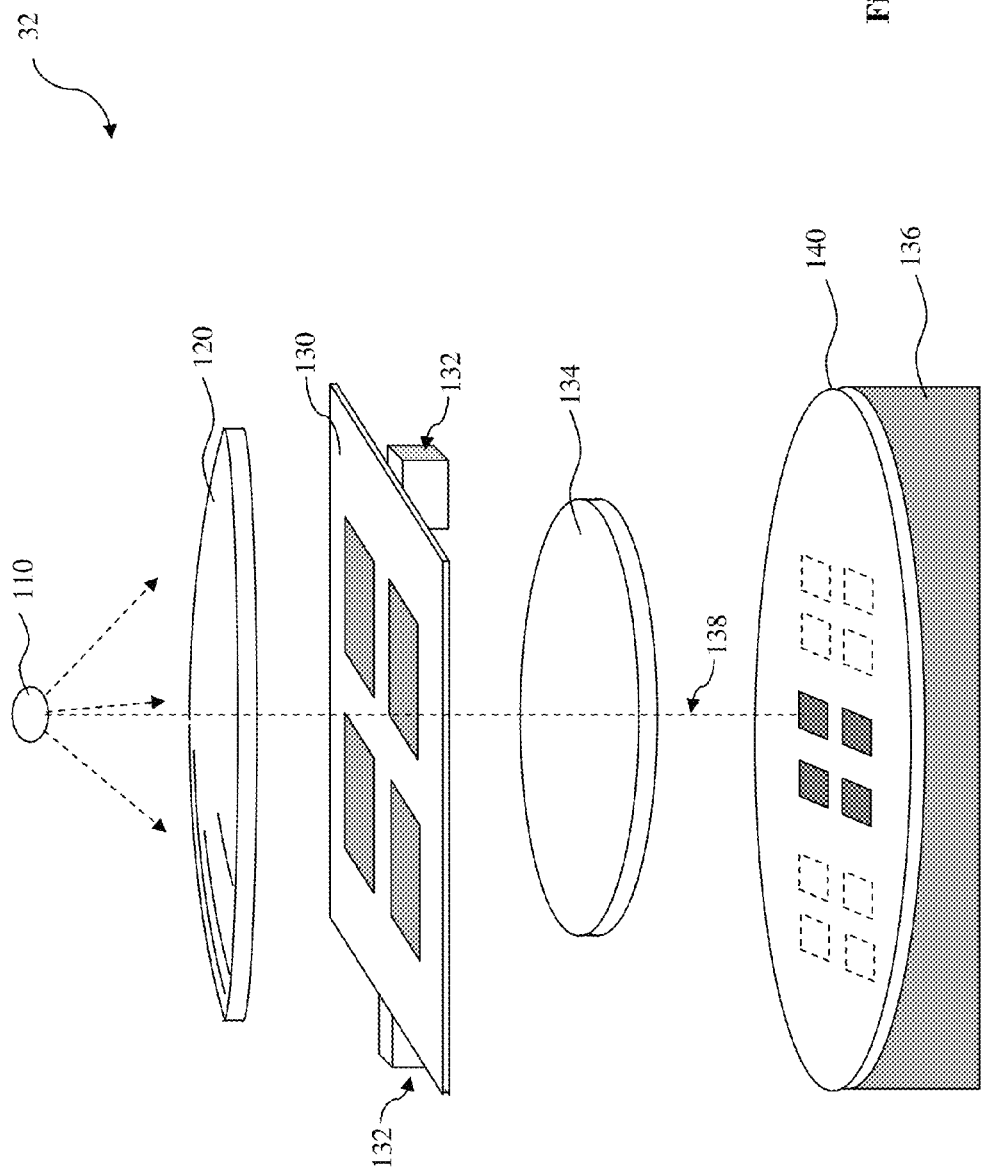

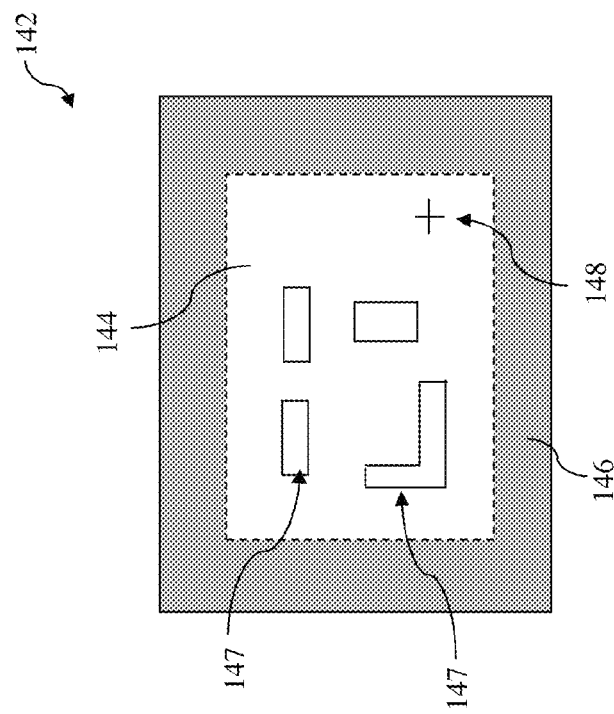
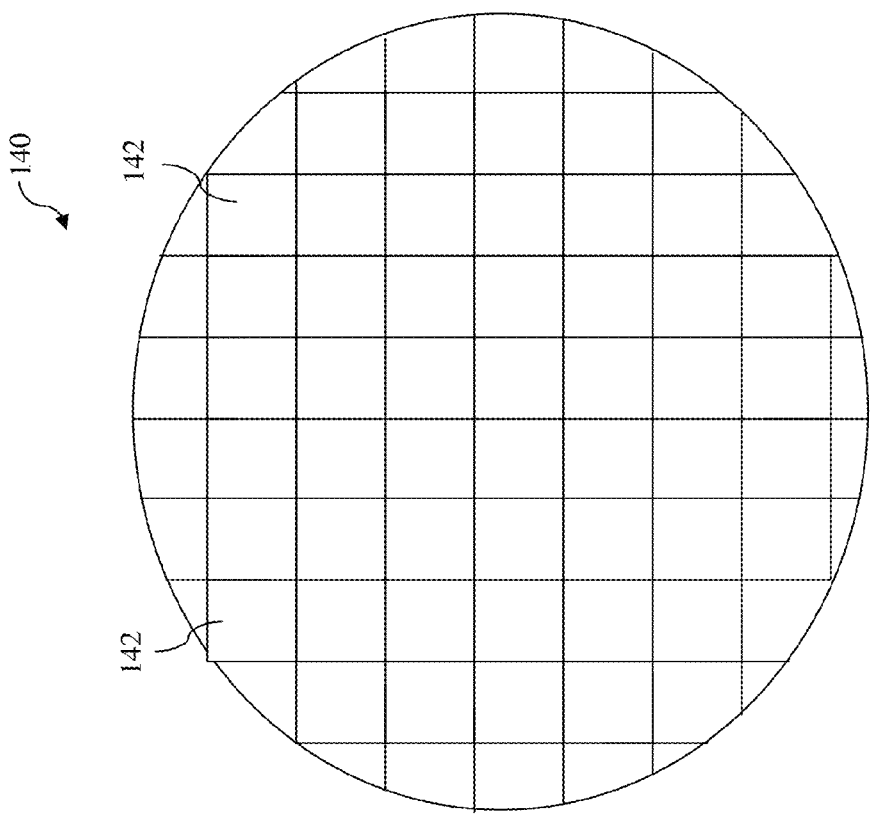
Fig. 4
Fig. 3

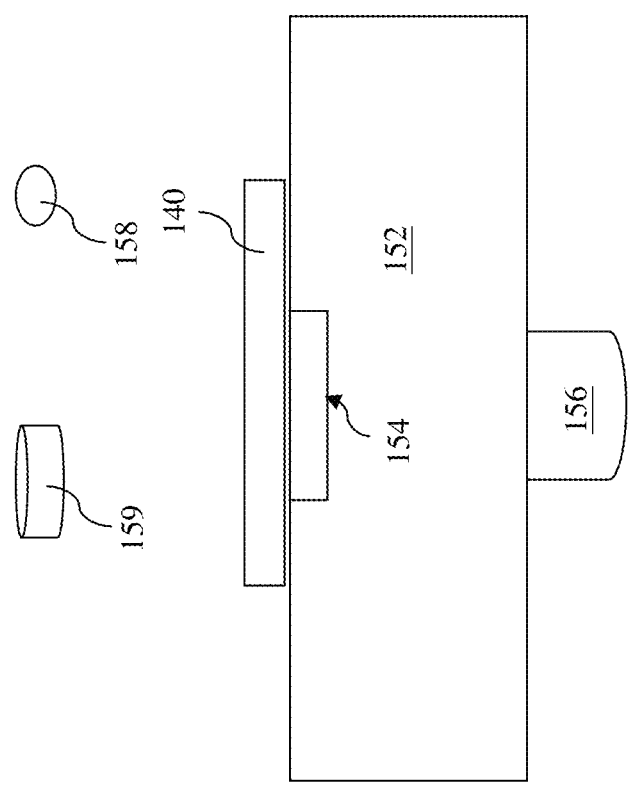

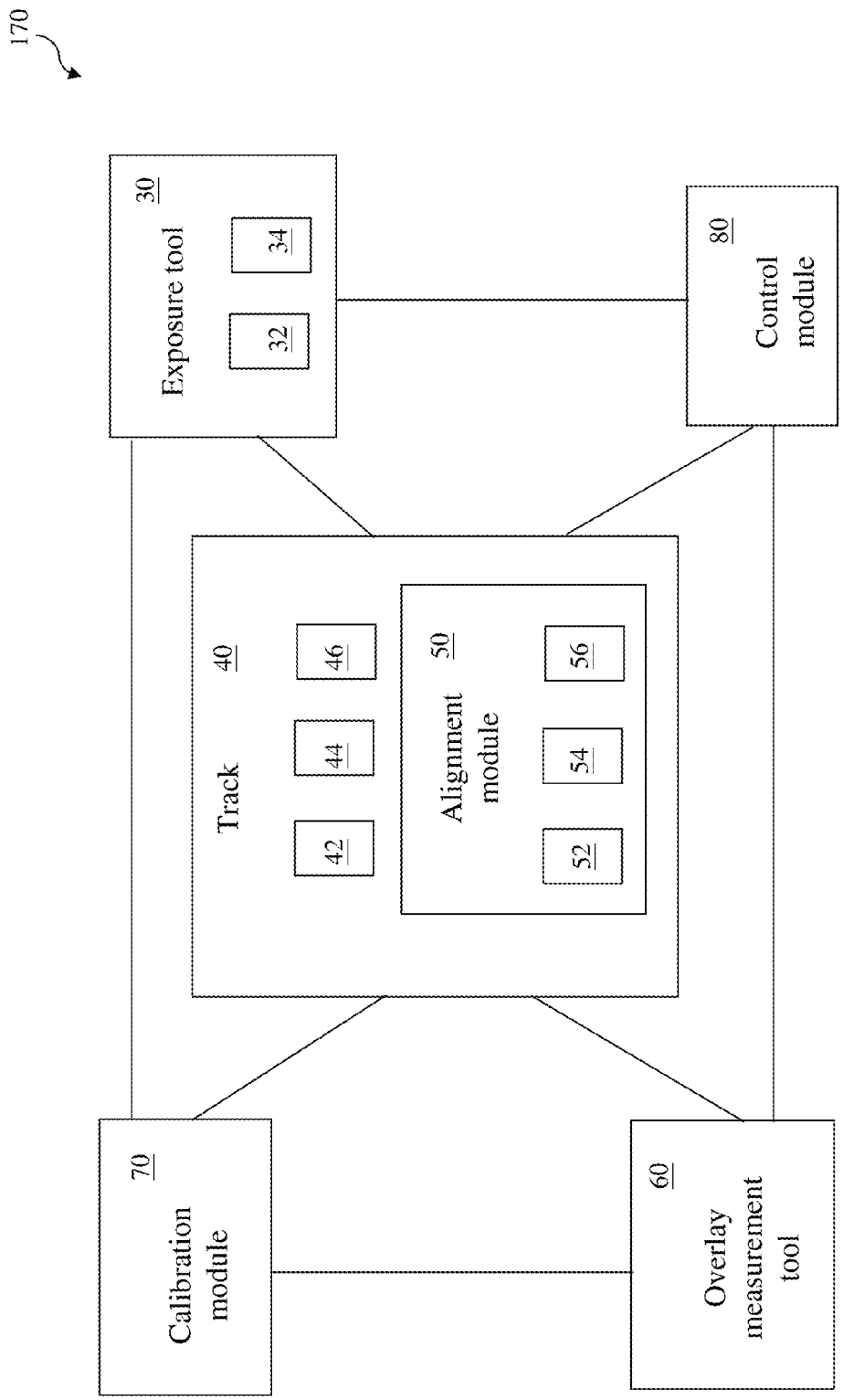

SYSTEM AND METHOD FOR LITHOGRAPHY PATTERNING

BACKGROUND

Semiconductor integrated circuit (IC) technology has experienced rapid progress including the continued minimization of feature sizes and the maximization of packing density. The minimization of feature size relies on improvement in photolithography and its ability to print smaller features or critical dimensions (CD). This is further related to wafer alignment. The wafer alignment is performed in the lithography scanner. The scanner will expose the wafer based on the alignment result. To reduce the overlay error, it is needed to improve the alignment accuracy and the overlay measurement accuracy result. However, during a photolithography process, the wafer may experience wafer bending and deformation caused by wafer clamping (chucking) and other factors, such as thermal treatment. The existing alignment method does not consider the positioning error caused by the wafer clamping. The positioning error measured is different from that experienced by the lithography scanner. Furthermore, the existing alignment measurement is inaccurate and inefficient.

Therefore, an apparatus for lithography patterning and a method utilizing the same are needed to address the above issues associated with the alignment.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 2 is a schematic view of a lithography exposure module constructed according to aspects of the present disclosure in one or more embodiments.

FIG. 3 is a top view of a wafer used in the lithography system of FIG. 1 constructed according to aspects of the present disclosure in one or more embodiments.

FIG. 4 is a fragmentary top view of the wafer of FIG. 3 constructed according to aspects of the present disclosure in one or more embodiments.

FIG. 5 is a schematic view of an alignment unit constructed according to aspects of the present disclosure in one or more embodiments.

FIG. 10 is a block diagram illustrating a lithography system constructed according to aspects of the present disclosure in other embodiments.

DETAILED DESCRIPTION

Figure 1:
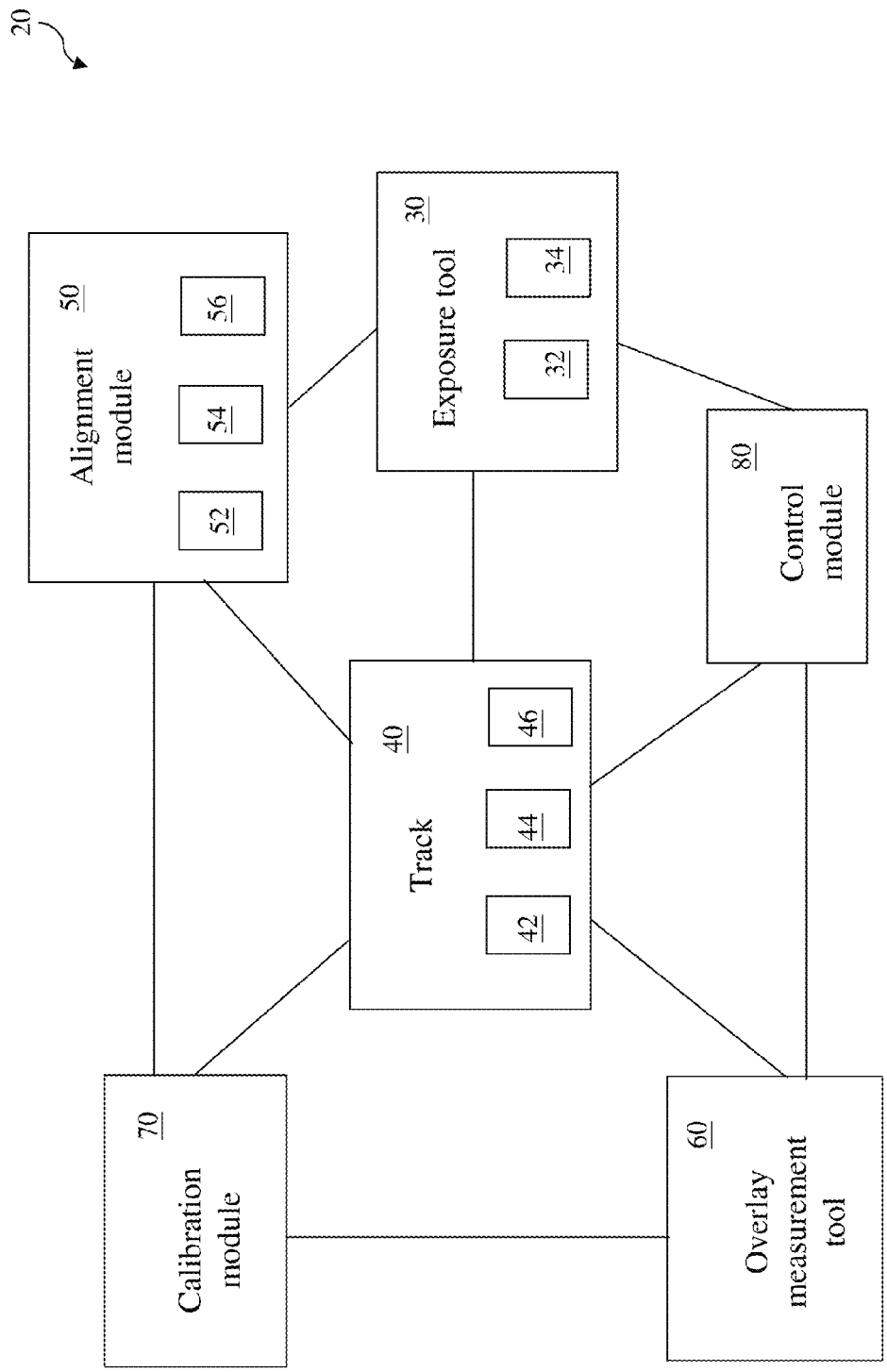
FIG. 1 is a block diagram illustrating a lithography system constructed according to aspects of the present disclosure in one or more embodiments.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a schematic view of a lithography system 20 for performing various lithography patterning processes constructed according to various aspects of the present disclosure. With reference to FIG. 1 and other figures, the lithography system 20 and the method utilizing the same are collectively described. The lithography system 20 includes various processing tools and metrology tools coupled together and configured for performing various lithography processes including coating, alignment, exposure, baking, developing and/or other lithography patterning processes. Therefore, those coupled processing tools and metrology tools are collectively referred to as a lithography system 20. However, each tool of the lithography system 20 may be reconfigured, such as being reconfigured to be coupled with other lithography tools or be a part of another lithography system.

Referring to FIG. 1, the lithography system 20 includes a lithography exposure tool (or exposure tool) 30 designed to perform a lithography exposure process to a radiation-sensitive material layer (e.g., photoresist layer or resist layer). The exposure tool 30 is designed operable to implement a proper mechanism of a lithography process. In one example, an exposure mode is implemented such that the image of a photomask is formed on a wafer by one shot. In another example, a step-and-exposure mode is implemented such that the image of the photomask is repeatedly formed on a plurality field regions of the wafer. In the present example, a step-and-scan mode is implemented such that the image of the photomask is repeatedly scanned to a plurality field regions of the wafer. Therefore, the lithography exposure tool 30 is also referred to as a scanner.

The lithography exposure tool 30 includes an exposure module 32, which is further described with reference to FIG. 2 in a schematic view.

Referring to FIG. 2, the exposure module 32 includes a radiation source (or source) 110 to provide radiation energy. The radiation source 110 may be any suitable light source. In various embodiments, the radiation source may include a light source selected from the group consisting of ultraviolet (UV) source, deep UV (DUV) source, extreme UV (EUV) source, and X-ray source. For example, the radiation source 110 may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; or other light sources having a desired wavelength (e.g., below approximately 100 nm). In another example, the light source is an EUV source having a wavelength of about 13.5 nm or less.

The exposure module 32 also includes an optical subsystem that receives the radiation energy from the radiation source 110, modulates the radiation energy by the image of a photomask and directs the radiation energy to a resist layer coated on an integrated circuit substrate (such as a semiconductor wafer or a wafer). In one embodiment, the optical subsystem is designed to have a refractive mechanism. In this situation, the optical subsystem includes various refractive components, such as lenses. In another embodiment where the radiation energy is EUV energy, the optical subsystem is designed to have a reflective mechanism. In this situation, the optical subsystem includes various reflective components, such as mirrors.

In an embodiment, the exposure module 32 includes an illumination unit (e.g., a condenser) 120. The illumination unit 120 may include a single lens or a lens module having multiple lenses and/or other lens components. For example, the illumination unit 120 may include microlens arrays, shadow masks, and/or other structures designed to aid in directing radiation energy from the radiation source 110 onto a reticle (also referred to as photomask or mask) 130.

During a lithography exposure process (or exposure process), the photomask (mask or reticle) 130 is positioned in the exposure module 32 such that an integrated circuit pattern defined thereon is imaged on the resist layer. In one embodiment, the reticle 130 includes a transparent substrate and a patterned absorption layer. The transparent substrate may use fused silica ($SiO_2$) relatively free of defects, such as borosilicate glass and soda-lime glass. The transparent substrate may use calcium fluoride and/or other suitable materials. The patterned absorption layer may be formed using a plurality of processes and a plurality of materials, such as depositing a metal film made with chromium (Cr) and iron oxide, or an inorganic film made with MoSi, ZrSiO, SiN, and/or TiN. A light beam may be partially or completely blocked when directed on an absorption region. The absorption layer may be patterned to have one or more openings through which a light beam may travel without being absorbed by the absorption layer. The mask may incorporate other resolution enhancement techniques such as phase shift mask (PSM) and/or optical proximity correction (OPC).

In another embodiment where the radiation energy is EUV energy, the reticle is designed to have reflective mechanism. The reticle includes a substrate coated with a plurality of films to provide a reflective mechanism. For example, the reticle includes tens alternating layers of silicon and molybdenum deposited on a substrate to act as a Bragg reflector that maximizes the reflection of EUV light. The reticle may further include a capping layer, such as ruthenium, to prevent oxidation. In one embodiment, the reticle further includes an antireflective layer, such as a tantalum boron nitride film, to define a layout pattern of an integrated circuit.

The reticle 130 is secured on a reticle stage 132 of the exposure module system 32 by a clamping mechanism (not shown), such as vacuum clamping or e-chuck clamping. In the present embodiment, the clamping mechanism is a portion of the reticle stage 132. The reticle stage 132 is designed and configured to be operable for translational and rotational motions according to the present embodiment. In another embodiment, the reticle stage 132 is further designed operable to tilt such that the reticle is tilted to (not parallel with) a wafer to be patterned in the exposure module 32.

Still referring to FIG. 2, the exposure module 32 includes an projection unit 134. The projection unit 134 may have a single lens element or a plurality of lens elements configured to provide proper illumination to the resist layer on a wafer. Each lens element may include a transparent substrate and may further include a plurality of coating layers. The transparent substrate may be a conventional projection lens, and may be made of fused silica ($SiO_2$), calcium-fluoride ($CaF_2$), lithium fluoride (LiF), barium fluoride ($BaF_2$), or other suitable material. The materials used for each lens element may be chosen based on the wavelength of light used in the lithography process to minimize absorption and scattering. The illumination unit 120 and the projection unit 134 are collectively referred to as an imaging sub-module. The imaging sub-module may further include additional components such as an entrance pupil and an exit pupil to form an image of the reticle 130 on a wafer to be patterned. In another embodiment, the imaging sub-module may alternatively include various mirror components to provide a reflective mechanism of imaging.

Still referring to FIG. 2, the exposure module 32 further includes a substrate stage 136 that is capable of securing and moving a substrate 140 such that the substrate 140 is aligned with the reticle 130. The substrate 140 is secured on a substrate stage 136 by a clamping mechanism, such as vacuum clamping or e-chuck clamping. In one embodiment, the substrate stage 136 is further designed and configured to be operable for translational and rotational motions according to the present embodiment. In another embodiment, the substrate stage 136 is further designed operable to tilt or dynamically change the tilt angle relative to the optical axis 138 of the exposure module 32 such that the substrate is not perpendicular to the optical axis 138.

The exposure module 32 may be designed differently according to different characteristics of the radiation source and other factors. In one example, the radiation source 110 includes an EUV source having a wavelength around 13.5 nm. In this case, the imaging sub-module is different due to the characteristics of the EUV, such as absorption. For example, the imaging module associated with the EUV source includes reflective optical components and reflective reticle, as noted above.

In another example, the exposure module 32 is designed to hold a liquid in the optical path between the projection lens 134 and the substrate 134 to enhance the resolution. Thus configured lithography system is also referred to as an immersion lithography exposure module.

In the present example, the substrate 140 is provided in the exposure module 32 for receiving a lithography process. In one embodiment, the substrate 140 is an integrated circuit substrate (IC substrate), such as a semiconductor wafer (or wafer) having an elementary semiconductor such as crystal silicon, polycrystalline silicon, amorphous silicon, germanium, and diamond, a compound semiconductor such as silicon carbide and gallium arsenic, an alloy semiconductor such as SiGe, GaAsP, AlInAs, AlGaAs, and GaInP, or a combination thereof. In furtherance of the present embodiment, a resist layer is coated on the substrate 140 and receives the radiation energy from the radiation source 110 during a lithography exposure process.

The substrate 140 is further described with reference to FIGS. 3 and 4 in top views. The wafer 140 includes a plurality of areas, referred to as fields 142. The wafer 140 includes a plurality of major fields 142 having complete IC circuits defined therein for one or more dies. The semiconductor wafer 140 further includes a plurality of partial fields 142 disposed on wafer edge areas. During a lithography process, the wafer is exposed one field at a time. The exposure module 32 scans the IC patterned defined in the reticle and transfers it to one field, then steps to next field and repast the scanning until the fields in the substrate 140 is exhausted. One field 142 may include one or more die, and is further illustrated in FIG.

4. In the present embodiment, each field includes a circuit region 144 and a frame region 146. A circuit pattern including various main features 147 is defined in the circuit region 144. Furthermore, a plurality of alignment marks 148 are defined for alignment measurement and are formed in the fields 142. In one embodiment, the alignment marks are fiducial marks. Each field includes a number of the alignment marks in the respective circuit region 144 and the respective frame regions 146 according to one embodiment.

Referring back to FIG. 1, the exposure tool 30 further includes an alignment unit 34 integrated with the exposure module 32. Both the exposure module 32 and the alignment unit 34 are integrated together to constitute main modules of the exposure tool 30. Therefore, the alignment unit 34 is also referred to as embedded alignment unit 34 since it is embedded in the exposure tool 30. In one embodiment, the exposure module 32 and the alignment unit 34 each include a respective substrate stage. In another embodiment, the exposure module 32 and the alignment unit 34 share one substrate stage that is designed and configured operable to move between the alignment unit 34 and the exposure module 32.

Still referring to FIG. 1, the lithography system 20 also includes a lithography track unit (simply track) or a plurality of tracks 40 coupled with the exposure tool 30. The track 40 is a processing tool that integrates resist processing into one tool. The resist processing includes coating, baking and development according to one embodiment. In the present embodiment, the track 40 further includes a coating module 42, a development module 44 and a baking module 46. In another embodiment, the resist processing includes coating, soft-baking, hard-baking and development. In this embodiment, the track 40 may include two or more baking modules designed or configured for baking at different temperatures, respectively. The track 40 is coupled with the exposure tool 30 such that wafers can be exchanged between them.

Still referring to FIG. 1, the lithography system 20 also includes an alignment module 50 configured to be coupled with the exposure tool 30 according to the present disclosure. The alignment module 50 is coupled with the exposure tool 30 such that the wafers through the alignment module 50 are sent to the exposure tool 30 for corresponding steps. Specifically, the alignment module 50 is coupled with the exposure tool 30 such that wafers can be transferred from the alignment module 50 to the exposure tool 30. The alignment module 50 is designed to perform alignment measurement to wafer. However, the alignment module 50 is different from the embedded alignment module 34. The embedded alignment module 34 is embedded in the exposure tool 30 and is a part of the exposure tool 30. The alignment module 50 is separate from the exposure tool but is configured to work together with the exposure tool 30. Therefore, the alignment module 50 can be reconfigured. In one embodiment, the alignment module 50 includes one alignment unit that is similar to the embedded alignment unit 34 in one example. In another embodiment, the alignment module 50 includes a plurality of alignment units, such as a number of alignment units wherein the number is an integer (e.g., 1, 2, 3, and etc.). In the present example, three exemplary alignment units 52, 54 and 56 are included in the alignment module 50.

In one embodiment, the alignment process includes measure the alignment marks relative to a reference structure, such as a virtual grid, to define the alignment error. In one embodiment, thus measured alignment error is used for a proper tuning process to reduce the alignment error and the overlay error. In another embodiment, the measured alignment error is used for a calibration process, which will be described later.

FIG. 5 illustrates an schematic view of an exemplary position unit 150 that may be incorporated in an alignment unit of the alignment module 50 or incorporated in the embedded alignment unit 34. The position unit 150 is designed operable to position a substrate and to monitor the location of the substrate. In one embodiment, the position unit 150 includes a substrate stage 152 designed to hold a substrate to be processed, such as the substrate 140. The substrate stage 152 is similar to the substrate stage 136 in one embodiment. The substrate stage 152 includes a clamping mechanism to secure the substrate. In various embodiment, the clamping mechanism may includes a vacuum, e-chuck or other suitable clamping mechanism. The substrate stage 152 also includes a motion mechanism 156 to move the secured substrate 140 in transitional and rotational modes.

The position unit 150 includes a position signal source 158 to provide a position signal (such as a light beam). In one embodiment, the position signal source 158 includes a laser source for a laser light with a proper wavelength. The position unit 150 also includes an position sensor 159 designed to receive the position signal. In one embodiment, the position sensor 159 includes one sensing unit, such as a photodiode or a photodiode array, to receive the position signal. In another embodiment, the position sensor 159 includes a phase grating alignment sensor. The position unit 150 may further include other component, such as proper optical features, integrated with the position source 158 and the position sensor 159. The position source 158 and the position sensor 159 are configured to check the position of the substrate 140 through a proper mechanism, such as diffraction, imaging or scatterometry.

Back to FIG. 1, the lithography system 20 includes an overlay measurement tool 60 designed to perform an overlay measurement after the resist layer is patterned. For example, the overlay error is measured between the patterned resist layer and the underlying material layer on the substrate 140. In one embodiment, the overlay measurement tool 60 includes a position unit similar to the position unit 150. In one example, the overlay measurement tool 60 stands alone. I another example, the overlay measurement tool 60 is integrated with the track 40.

Still referring to FIG. 1, the lithography system 20 includes a calibration module 70 designed for alignment calibration. In one embodiment, the calibration module 70 is designed to stand alone and couple with other tools of the lithography system 20. In another embodiment, the calibration module 70 is integrated with and distributed in other tool of the lithography system 20. For example, the calibration module 70 is distributed in and integrated with the alignment module 50. In another example, the calibration module 70 is distributed in and integrated with the track 40.

The calibration module 70 is designed to perform a calibration process among different position units, such as the embedded position unit 34 and the position units of the alignment module 50. In one example, the calibration module 70 is implemented to determine the clamping difference and provide a tuning amount to tune the respective clamping mechanism (such as e-chuck) to eliminate or reduce the chuck difference. The calibration process may utilize a reference wafer having alignment marks formed thereon. The alignment marks may be designed to a proper shape, pattern and size for alignment and calibration measurements.

The calibration process is necessary since the alignment measurements from a position unit may introduce a stress to a wafer by the respective position unit. The stress causes the deformation of the wafer and varies the alignment data. Furthermore, the stress would be different when the wafer is clamped by a different position unit. Therefore, the alignment measurement from a different position unit may not present the alignment environment of the exposure tool 30 during the exposure process. This is further described with reference to FIGS. 6 through 9 that illustrate top views of a substrate 160 clamped on various position units of the lithography system 20. In the present embodiment, the substrate 160 is a reference wafer for calibration, therefore also referred to as calibration wafer. The wafer 160 includes a plurality of alignment marks 148 formed thereon.

Figure 7:
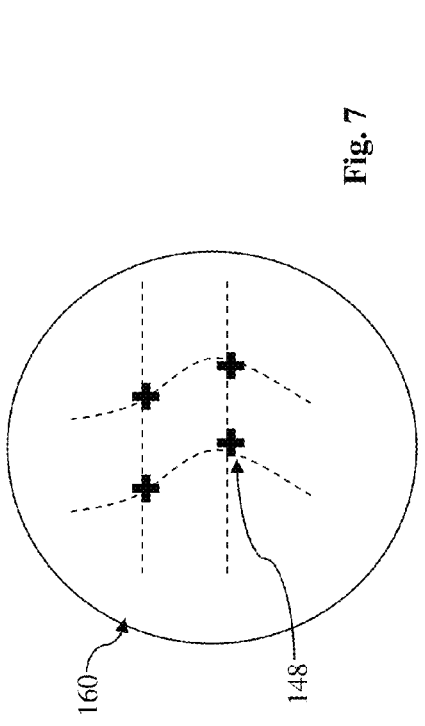
FIGS. 6 through 9 illustrate a wafer on various modules of the lithography system of FIG. 1 constructed according to aspects of the present disclosure in various embodiments.
Figure 6:
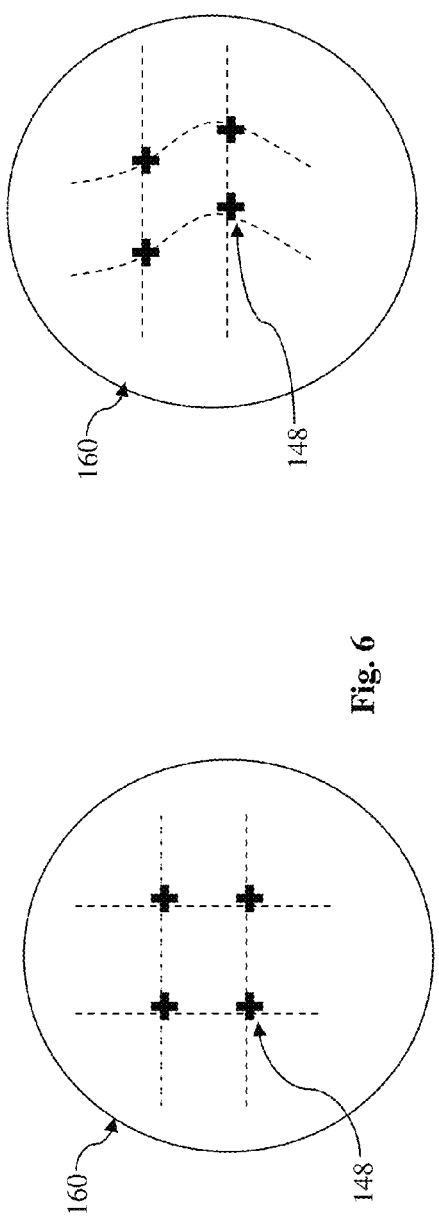
Figure 9:
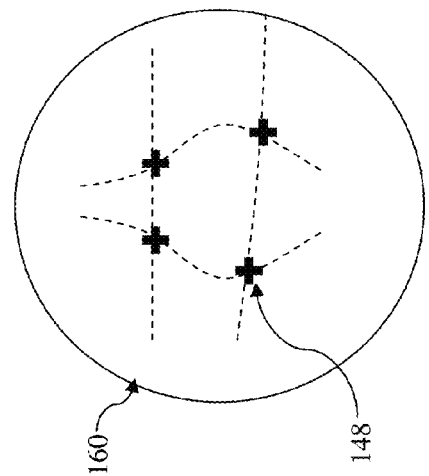
Figure 8:
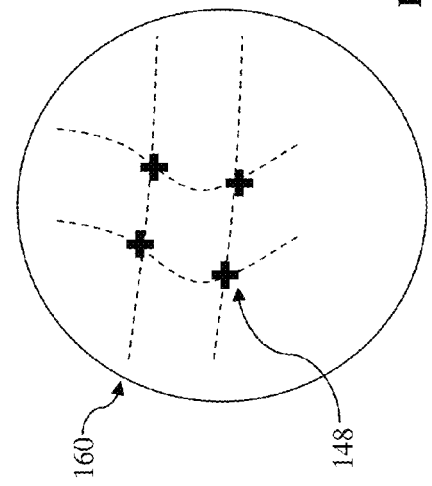

The wafer 160 free of clamping is illustrated in FIG. 6. In this situation, the wafer 160 is substantially free of stress since the wafer 160 is not clamped. FIG. 7 illustrates the wafer 160 clamped in the exposure module 30. Due to the stress induced by the respective clamping, the wafer 160 is distorted accordingly. FIGS. 8 and 9 illustrate the wafer 160 clamped in the alignment module 50 and the overlay measurement tool 70, respectively. Due to the stress induced by the respective clamping, the wafer 160 is distorted differently relative to the distortion in FIG. 7. According to the present disclosure, the calibration process using a reference wafer provides chucking differences (such as mechanical strength differences) among different position units. In one embodiment, the chucking differences may be provided in a grid format such that the difference at each location is given. The chucking differences may be used to tune the respective clamping mechanism (such as e-chuck) to minimize the chucking difference. In another embodiment, the chucking differences may be used for more accurate prediction of the wafer overlay error during the exposure process and may further be used for tuning the lithography system 20 to reduce the overlay error.

Referring to FIG. 1, the lithography system 20 may further includes a control module 80 designed for controlling the exposure tool 30 or for controlling other portion of the lithography system 20 to tune various parameters in order to eliminate or reduce the overlay error. In one embodiment, the control module 80 may base on the alignment data from the alignment measurement to perform a tuning process. In one example, the tuning process includes tuning the clamping mechanism of the respective position unit to reduce the chuck difference. In another embodiment, the tuning process includes tuning the wafer (or reticle) tilting and/or the imaging module of the exposure tool 30 to reduce the overlay error. In yet another embodiment, the tuning process includes transitional shift and/or rotational shift of the wafer during the exposure process. In yet another embodiment, the tuning process includes dynamically tuning the exposure dose or imaging lens. In various embodiments, the control module 80 may be configured to stand alone or integrated with and couple with other tools of the lithography system 20, such as the exposure tool 30.

The lithography system 20 may includes other components to be coupled with other tools or components of the lithography system 20 for performing various lithography processes. Particularly, the lithography system 20 includes the alignment module 50 coupled with the exposure tool 30 and further coupled with or distributed in the track 40. The alignment module 50 is different from the alignment unit 34 since the alignment unit 34 is embedded in the exposure 30 and is a part of the exposure tool. The alignment module 50 is coupled with but is not a part of the exposure tool 30.

With the alignment module coupled with the exposure tool 30 and provided with alignment measurement for the exposure tool 30, the exposure tool 30 is fully utilized for the exposure process. Considering the situation wherein the exposure tool 30 includes the embedded alignment unit 34, if the alignment measurement takes longer time than that of the exposure process, this will causes the exposure module 32 to be idle for a fraction of its production time. The productivity and throughput are thus reduced and the manufacturing cost and cycle time are increased.

The alignment module 50 includes a number of the alignment units (e.g., 52, 54 and 56) as a function of the throughput of the lithography exposure process implemented in the exposure tool. In one embodiment, the number of the alignment units coupled with the exposure tool 30 is chosen such that the alignment measurements to wafers by the alignment module 50 substantially match the exposure process to the wafers by the exposure tool 50 with minimized traffic jam in the processing flow. For example, when the exposure process takes longer time, the number of the alignment units in the alignment module 50 is smaller, such as 2. In another example, when the exposure process takes shorter time, the number of the alignment units in the alignment module 50 is greater, such as 3. The alignment module 50 is reconfigurable depending on the exposure process of the exposure module 30. The alignment module 50 is operable to be reconfigured with a different number of the alignment units such that the alignment measurement in the alignment module 50 and the exposure process in the exposure tool 30 are matched with substantial utilization of the exposure tool 30 and the alignment module 50.

In another embodiment, the substantial utilization of the exposure tool 30 and the alignment module 50 takes consideration of the embedded alignment unit 34 for the alignment measurement. Therefore, the alignment module 50 is operable to be reconfigured with a different number of the alignment units such that the alignment measurement in the alignment module 50 and the embedded alignment unit 34 matches the exposure process in the exposure tool 30 with substantial utilization of the exposure tool 30 and the alignment module 50.

As noted above, the lithography system 20 in FIG. 1 may be configured differently. For example, the alignment module 50 may be distributed in and integrated with the track 40, such as the lithography system illustrated in FIG. 10.

Figure 11:
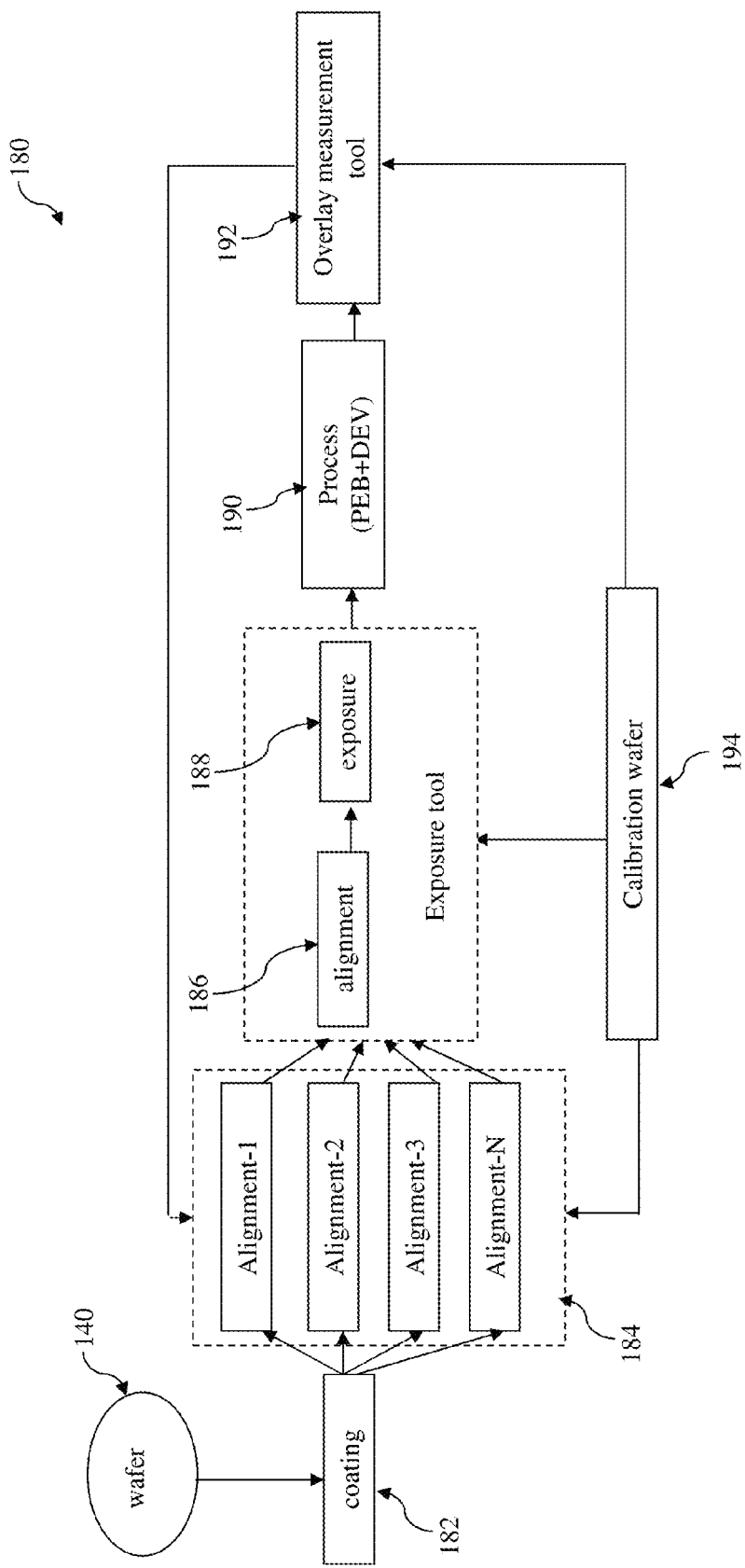
FIG. 11 is a block diagram illustrating various embodiments of the lithography system of FIG. 1 and process flow implemented therein, constructed according to aspects of the present disclosure in one or more embodiments.

FIG. 11 is a block diagram illustrating a lithography process flow 180 constructed according to aspects of the present disclosure in one embodiment. The lithography process is implemented by the lithography system 20 of FIG. 1 or the lithography system 170 of FIG. 10 in the present embodiment. Therefore, the lithography process flow 180 is described with reference to FIG. 11 and FIG. 1 (or FIG. 10) as well. In the disclosed lithography process, a wafer 140 is coated with a radiation-sensitive material layer (or a resist layer), as illustrated in block 182. This step may be implemented by the track 40. Other steps may follow the resist coating, such as soft baking.

After the coating, an alignment measurement is applied to the wafer 140, as illustrated in block 184. This step is implemented by the alignment module 50. As noted above according to one embodiment, the alignment module 50 includes a number of alignment units configured in parallel, such as "Alignment-1", "Alignment-2", "Alignment-3", . . . and "Alignment-N". In this case, N wafers can be sent for alignment measurement in parallel. When the alignment measurement is a bottleneck relative to the exposure process. By configuring with N alignment units, the alignment measurement process can be speeded up and is N-time faster to reduce the process congestion and fully utilize the exposure module 32. In one example, the alignment measurement to the wafer 140 is implemented in one alignment unit of the alignment module 50. The alignment measurement in the alignment module is also referred to as major alignment measurement.

The wafer 140 may be sent to the exposure tool 30 for another alignment measurement in the embedded alignment unit 34, as illustrated in block 186. The alignment measurements from both the alignment module 50 and the embedded alignment unit 34 may be used for calibration and/or used for a tuning process to compensate the overlay error during the exposure process. The tuning process may be implemented through the control module 80.

The wafer 140 is then moved for an exposure process to transfer the IC pattern from the respective reticle to the resist layer coated on the wafer, as illustrated in block 188. The exposure process is implemented in the exposure module 32 of the exposure tool 30.

In one embodiment, the exposure module 32 and the alignment unit 34 each include a respective substrate stage. In this case, the wafer 140 is transferred from the substrate stage of the alignment unit 34 to the substrate stage of the exposure module 32. In another embodiment, the exposure module 32 and the alignment unit 34 share one substrate stage that is designed and configured operable to move between the alignment unit 34 and the exposure module 32. In this case, the wafer 140 is clamped on the shared wafer stage. After the alignment measurement to the wafer 140 in the alignment unit 34, the wafer 140 with the shared substrate stage is moved to the exposure module 32 for the respective exposure process.

The wafer 140 is then sent for following lithography processing steps to form a patterned resist layer, as illustrated in block 190. Those lithography processing steps include post-exposure-baking (PEB) and development according to one embodiment. Those lithography processing steps may be implemented in respective modules of the track 40.

The wafer 140 is then sent for an overlay measurement, as illustrated in block 192. The overlay measurement is implemented in the overlay measurement tool 70 for the overlay errors between the patterned resist layer and the underlying material layer of the wafer 140.

The lithography processing flow 180 also includes a calibration process using a calibration wafer (or reference wafer), as illustrated in block 194. The calibration process is based on the alignment measurements in the alignment module 50, the exposure tool 30 and the overlay measurement tool 70. The calibration process may be further associated with a tuning process applied to the various corresponding position units to reduce the clamping difference by tuning the clamping strength, in one embodiment.

Figure 12:
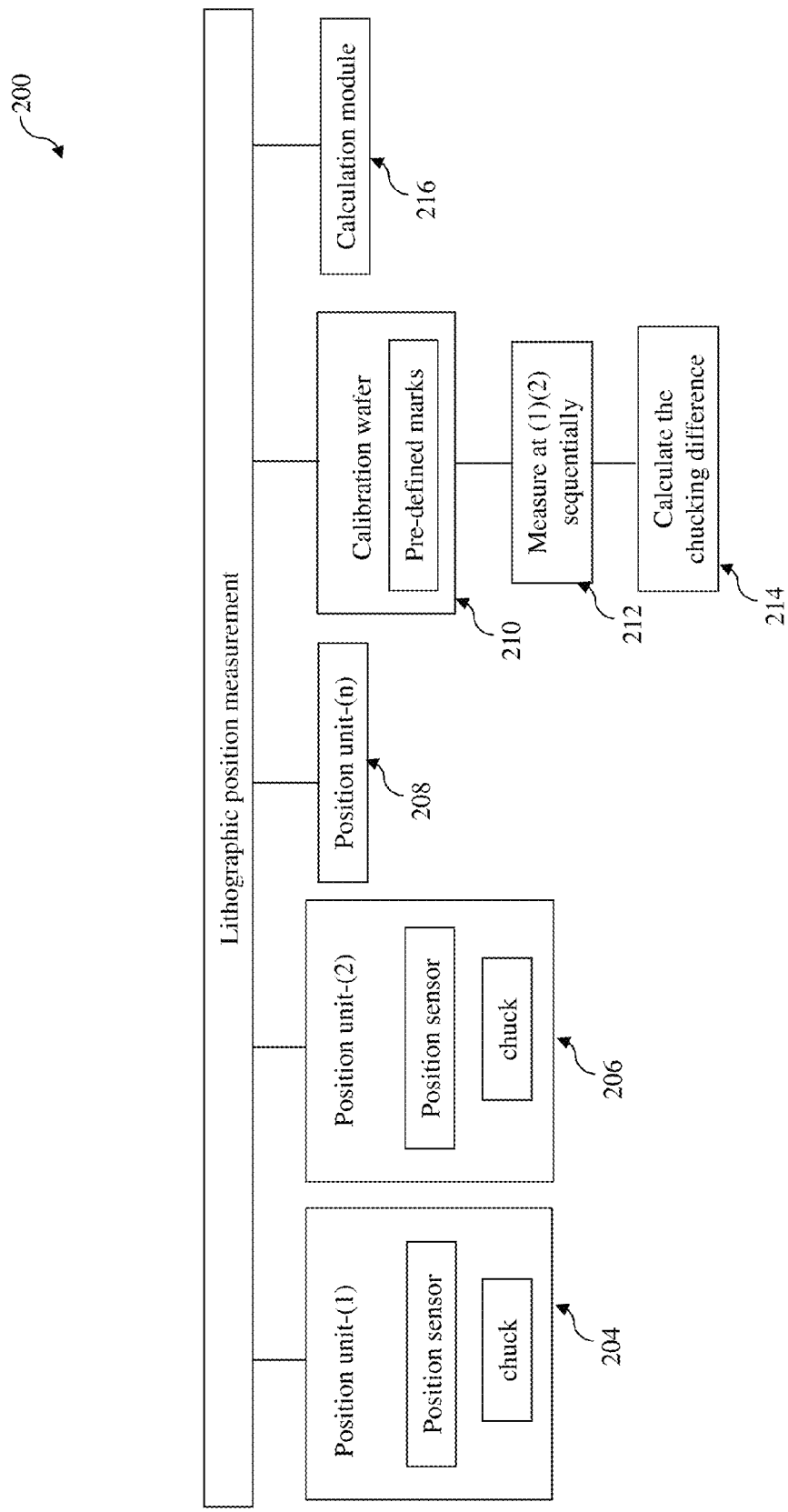
FIG. 12 is a block diagram illustrating a processing flow of a lithography positioning measurement implemented in the lithography system of FIG. 1 constructed according to aspects of the present disclosure in one or more embodiments.

FIG. 12 is a block diagram illustrating a lithography position measurement 200 constructed according to aspects of the present disclosure in another embodiment. The lithography position measurement is implemented in the lithography system 20 of FIG. 1 or the lithography system 170 of FIG. 10 in the present embodiment. Therefore, the lithography process flow 180 is described with reference to FIG. 11 and FIG. 1 (or FIG. 10) as well. The lithography system 20 includes a plurality of position units. In the present embodiment, the number of the alignment units in the alignment module 50 each include a position unit; the embedded alignment unit 34 includes a position unit; and the overlay measurement tool 70 includes a position unit. Those position units are referred to as first, second, . . . , nth position units. The position units are labeled as position unit-(1), position unit (2), . . . and the position unit (n), respectively, as illustrated in blocks 204, 206 and 208. Each position unit is similar to the position unit 150 of FIG. 5. For example, each position unit includes a clamping mechanism (or chuck) to secure a wafer and a position sensor for monitoring the position of the wafer. The position sensor may uses a sensing technology, such as diffraction, imaging, or scatterometry.

In the disclosed lithography position measurement, a wafer, such as a calibration wafer, is used for the position measurement, as illustrated in block 210. The calibration wafer is sent to for position measurements in the first and second position units sequentially, as illustrated in block 212. In various embodiments, the frequency of such position measurements is a function of one or more factors, such as the specification the alignment error, and/or the chuck force variation. Then, the chucking difference between the first and second position units are calculated, as illustrated in block 214. The calculation for the chucking difference may be implemented by a calculation module, as illustrated in block 216. The calculation module may be integrated in the control module 80 or integrated in the overlay measurement tool 70.

Figure 13:
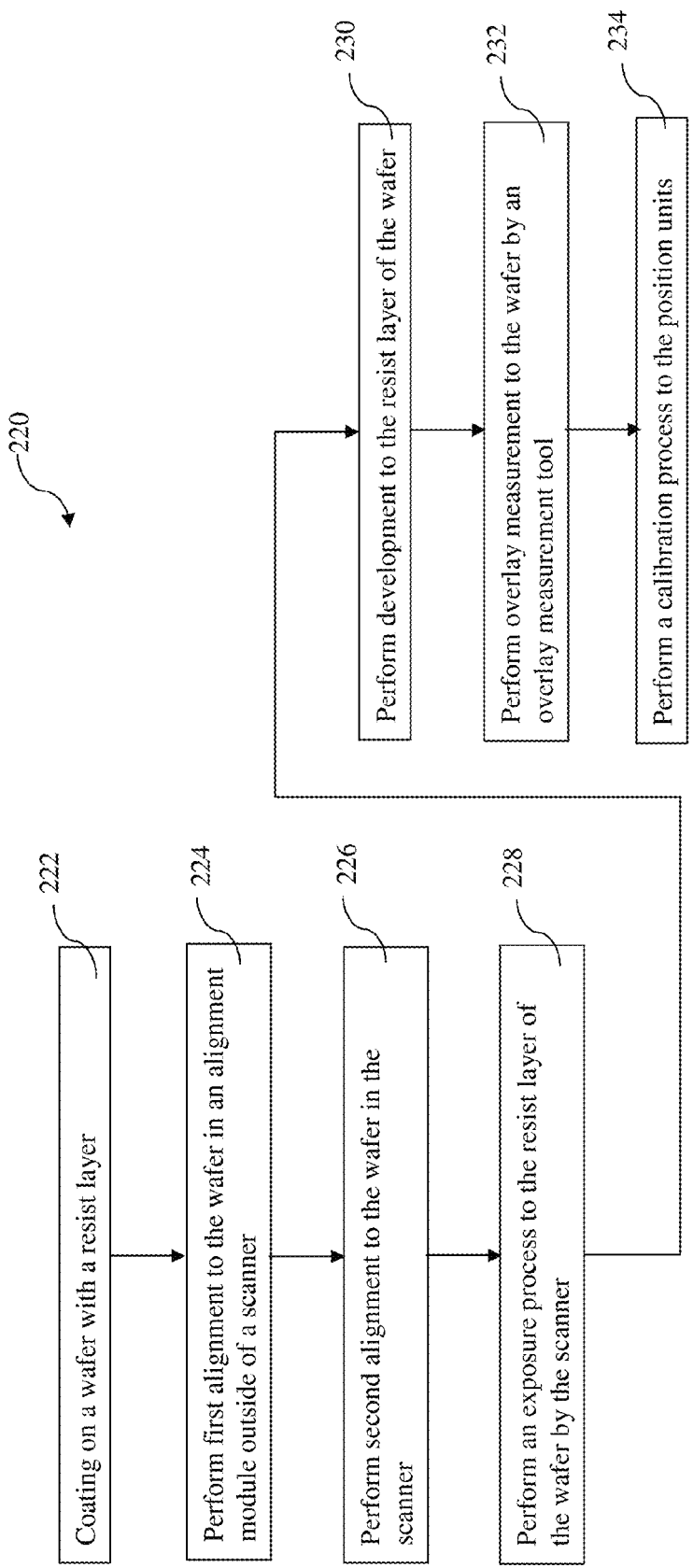
FIG. 13 is a flowchart of a method to implement the lithography system of FIG. 1 constructed according to aspects of the present disclosure in one embodiment.

FIG. 13 is a flowchart illustrating a method 220 of a lithography process performed by the lithography system 20 of FIG. 1 or the lithography system 170 of FIG. 10 according to various embodiments. The method 220 is described with reference to FIG. 13 and other figures. The method 220 begins at step 222 by coating a wafer with a resist layer.

At step 224, a first alignment is performed to the wafer in an alignment unit of the alignment module 50. At step 226, a second alignment is performed to the wafer in the embedded alignment unit 34. At step 228, an exposure process is applied to the wafer in the exposure tool. Particularly, the exposure process is applied to the resist layer of the wafer by the exposure module 32.

At step 230, a development is applied to the resist layer of the wafer to form a patterned resist layer. A post-exposure-baking (PEB) may be applied to the resist layer prior to the development of the resist layer. The development and PEB are implemented in the track 40 according to the embodiment.

At step 232, an overlay measurement is performed on the wafer to determine the overlay error between the patterned resist layer and the underlying material layer of the wafer. The overlay measurement is executed by the overlay measurement tool 70.

At step 234, a calibration process is performed to determine the chucking difference between different position units. In one example, the calibration process is similar to the calibration process described in the block 194 of FIG. 11. The calibration process may determine other variations, such as wafer stage temperature.

Although various embodiments of the lithography system 20 and the method utilizing the same are provided according to various aspects of the present disclosure, other alternatives and modifications may be used without departure of the spirit of the present disclosure. In one embodiment, the lithography system 20 may also incorporate other techniques and components. For example, the lithography system may also include components and mechanism to implement an immersion lithography process. In another example, if the radiation energy is EUV beam, the optical lens and the reticles are reflective components. In another embodiment, a subset of the alignment units in the alignment module 50 is distributed in the track 40 and another subset is standalone.

By utilizing the lithography system 20 and implementing various disclosed methods, one or more advantages may present in different embodiments. In one example, the alignment measurement throughput is enhanced without processing congestion to the lithography exposure process. In another example, the alignment and overlay measurements are more accurate by using a calibration wafer to calibrate grid difference of each position unit (or chuck). In another example, the alignment and overlay measurements are more accurate by increasing the number of marks formed on the wafer. The workload of the alignment is increased accordingly. The alignment module 50 outside of the exposure tool 30 provides an enhanced capability of the alignment measurement without causing the processing congestion at the alignment measurement. In yet another embodiment, the alignment measurement data can be feedback for more precise overlay control.

Thus, the present disclosure provide a lithography system. The lithography system includes a lithography exposure tool designed for performing an exposure process to a radiation-sensitive material layer coated on an integrated circuit substrate; an alignment module coupled with the lithography exposure tool, designed for alignment measurement, and configured for transferring the integrated circuit substrate to the lithography exposure tool; and an alignment calibration module designed to calibrate the alignment module relative to the lithography exposure.

In one embodiment, the alignment module includes a number of alignment units, wherein the number is a function of process throughput of the lithography exposure tool. In another embodiment, the number of alignment units are configured in parallel for alignment measurement.

In another embodiment, the lithography exposure tool further includes an embedded alignment unit configured for receiving the integrated circuit substrate from the alignment module.

In another embodiment, the lithography exposure tool includes an exposure unit for the exposure process; and a substrate stage to hold the semiconductor wafer and being operable to move between the embedded alignment unit and the exposure module.

In another embodiment, the lithography exposure tool includes an exposure unit having a first substrate stage configured to hold the integrated circuit substrate during the exposure process; and the embedded alignment unit having a second substrate stage to hold the semiconductor wafer during an alignment measurement.

In yet embodiment, the alignment calibration module is designed to calibrate difference between the embedded alignment unit and the alignment module.

In another embodiment, the lithography system further includes a track unit designed for coating, baking and developing. In yet another embodiment, the alignment module is distributed in the track unit and is integrated with the track unit.

In another embodiment, the lithography system further includes an overlay measurement tool designed to measure overlay error after the developing. In yet another embodiment, the alignment calibration module is distributed in and integrated with the overlay measurement tool.

The present disclosure also provides another embodiment of a lithography system for lithography patterning. The lithography system includes a scanner designed for performing a lithography exposure process to a resist layer coated on a wafer; an alignment module coupled with the scanner and designed to perform an alignment measurement to the wafer; a track unit designed for processing the resist layer and coupled with the alignment module; an alignment calibration module designed to calibrate the alignment measured by the alignment module to alignment experienced by the wafer in the scanner during the lithography exposure process.

In one embodiment, the alignment module includes a plurality of alignment units configured in parallel. In another embodiment, the number of the alignment units is a function of throughput of the lithography exposure process of the scanner.

In yet another embodiment, the scanner includes an exposure module having a radiation source and an optical assembly configured to perform the lithography exposure process; and an embedded alignment unit designed for measuring alignment of the wafer.

In yet another embodiment, each of the alignment units and the embedded alignment unit includes a wafer stage to hold the wafer in the respective alignment unit; and an alignment sensor configured to receive alignment signal from the wafer. The alignment sensor may be designed with a mechanism selected from one of diffraction, imaging and scatterometry.

In another embodiment, the lithography system further includes an overlay measurement tool for overlay measurement after developing of the resist layer. The control module may be operable to dynamically tilt the reticle stage during an exposure process.

The present disclosure also provides an embodiment of a method for a lithography system. The method includes coating a wafer with a resist layer; performing a first alignment measurement in an alignment module; performing a second alignment measurement in an alignment unit embedded in a lithography exposure tool; performing a lithography exposure process to the resist layer by the lithography exposure tool; performing a developing process to the resist layer of the wafer; and performing an overlay measurement to the resist layer by an overlay measurement tool.

In one embodiment, the method further includes performing a calibration among the alignment module, the alignment unit and the overlay measurement tool; and tuning at least one check of the alignment module, the alignment unit and the overlay measurement tool.

In another embodiment of the method, the alignment module includes a number of alignment units configured in parallel and coupled with the lithography exposure tool, the method further includes dynamically changing the number of the alignment units coupled with the lithography exposure tool.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A lithography system, comprising:
a lithography exposure tool designed for performing an exposure process to a radiation-sensitive material layer coated on an integrated circuit substrate, wherein the lithography exposure tool includes an exposure substrate stage such that the integrated circuit substrate is disposed on the exposure substrate stage during performing of the exposure process to the radiation-sensitive material layer coated on the integrated circuit substrate, wherein the lithography exposure tool further includes an embedded alignment unit having a first alignment substrate stage and configured for performing a first alignment process on the integrated circuit substrate such that the integrated circuit substrate is disposed on the first alignment substrate stage during performing of the first alignment process on the integrated circuit substrate, wherein the embedded alignment unit is configured to provide the integrated circuit substrate to the exposure substrate stage after performing the first alignment process on the integrated circuit substrate;

an alignment module coupled with the lithography exposure tool, designed for alignment measurement, and configured for transferring the integrated circuit substrate to the lithography exposure tool, wherein the alignment module is separate from and disposed outside of the lithography exposure tool, wherein the alignment module includes a clamping mechanism and a second alignment substrate stage such that the integrated circuit substrate is disposed on the second alignment substrate stage during a second alignment process performed by the alignment module, wherein the alignment module is configured to provide the integrated circuit substrate to the first alignment substrate stage after performing the second alignment process on the integrated circuit substrate; and an alignment calibration module designed to calibrate the alignment module relative to the lithography exposure tool, wherein calibrating the measured alignment includes performing a tuning process that uses a tuning amount to tune the clamping mechanism to eliminate or reduce a clamping difference induced by the clamping mechanism during the second alignment process.

2. The lithography system of claim 1, wherein the alignment module includes a number of alignment units, wherein the number is a function of process throughput of the lithography exposure tool.

3. The lithography system of claim 2, wherein the number of alignment units are configured in parallel for alignment measurement.

4. The lithography system of claim 1, wherein the lithography exposure tool includes an exposure unit for the exposure process.

5. The lithography system of claim 4, wherein the alignment calibration module is designed to calibrate difference between the embedded alignment unit and the alignment module.

6. The lithography system of claim 1, further comprising a track unit designed for coating, baking and developing.

7. The lithography system of claim 6, wherein the alignment module is distributed in the track unit and is integrated with the track unit.

8. The lithography system of claim 1, further comprising an overlay measurement tool designed to measure overlay error after developing.

9. The lithography system of claim 8, wherein the alignment calibration module is distributed in and integrated with the overlay measurement tool.

10. A lithography system for lithography patterning, comprising:

a scanner designed for performing a lithography exposure process to a resist layer coated on a wafer, wherein the scanner includes an exposure wafer stage such that the wafer is disposed on the exposure wafer stage during performing of the lithography exposure process to the resist layer coated on the wafer, wherein the scanner further includes an embedded alignment unit having a first alignment wafer stage and configured for performing a first alignment process on the wafer such that the wafer is disposed on the first alignment wafer stage during performing of the first alignment process on the wafer, wherein the embedded alignment unit is configured to provide the wafer to the exposure wafer stage after performing the first alignment process on the wafer;

an alignment module coupled with the scanner and designed to perform an alignment measurement to the wafer, wherein the alignment module is separate from and disposed outside of the scanner, wherein the alignment module includes a clamping mechanism and a second alignment wafer stage such that the wafer is disposed on the second alignment wafer stage during a second alignment process performed by the alignment module, wherein the alignment module is configured to provide the wafer to the first alignment wafer stage after performing the second alignment process on the wafer;

a track unit designed for processing the resist layer and coupled with the alignment module; and an alignment calibration module designed to calibrate the alignment measured by the alignment module to alignment experienced by the wafer in the scanner during the lithography exposure process, wherein calibrating the measured alignment includes performing a tuning process that uses a tuning amount to tune the clamping mechanism to eliminate or reduce a clamping difference induced by the clamping mechanism during the second alignment process.

11. The lithography system of claim 10, wherein the alignment module includes a plurality of alignment units configured in parallel.

12. The lithography system of claim 11, wherein the number of the alignment units is a function of throughput of the lithography exposure process of the scanner.

13. The lithography system of claim 11, wherein the scanner includes an exposure module having a radiation source and an optical assembly configured to perform the lithography exposure process.

14. The lithography system of claim 13, wherein each of the alignment units includes a wafer stage to hold the wafer in the respective alignment unit; and an alignment sensor configured to receive an alignment signal from the wafer.

15. The lithography system of claim 14, wherein the alignment sensor is designed with a mechanism selected from one of diffraction, imaging and scatterometry.

16. The lithography system of claim 10, further comprising an overlay measurement tool for overlay measurement after developing of the resist layer.

17. The lithography system of claim 16, wherein a control module is operable to dynamically tilt a reticle stage during an exposure process.

18. A method for a lithography system, comprising:

coating a wafer with a resist layer;

performing a first alignment measurement in an alignment module, wherein the alignment module is separate from and disposed outside of a lithography exposure tool, wherein the alignment module includes a first alignment wafer stage such that the wafer is disposed on the first alignment wafer stage during performing of the first alignment measurement;

performing a second alignment measurement in an alignment unit embedded in the lithography exposure tool, wherein the alignment unit has a clamping mechanism and a second alignment wafer stage such that the wafer is disposed on the second alignment wafer stage during performing of the second alignment measurement;

performing a tuning process in the embedded alignment unit, wherein the tuning process includes using a tuning amount to tune the clamping mechanism to eliminate or reduce a clamping difference induced by the clamping mechanism during the second alignment measurement;

performing a lithography exposure process to the resist layer by the lithography exposure tool, wherein the lithography exposure tool includes an exposure wafer stage such that the wafer is disposed on the exposure wafer stage during performing of the lithography exposure process to the resist layer coated on the wafer;

performing a developing process to the resist layer of the wafer; and performing an overlay measurement to the resist layer by an overlay measurement tool.

19. The method of claim 18, further comprising performing a calibration among the alignment module, the alignment unit and the overlay measurement tool.

20. The method of claim 18, wherein the alignment module includes a number of second alignment units configured in parallel and coupled with the lithography exposure tool, the method further includes dynamically changing the number of the second alignment units coupled with the lithography exposure tool.

* * * * *